(12) United States Patent
Shen et al.

(10) Patent No.: US 7,425,809 B2
(45) Date of Patent: Sep. 16, 2008

(54) HEAT DISSIPATION DEVICES

(75) Inventors: Po-Hui Shen, Taoyuan Hsien (TW); Cheng-Chieh Liu, Taoyuan Hsien (TW); Ching-Sen Hsieh, Taoyuan Hsien (TW); Yueh-Lung Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 238 days.

(21) Appl. No.: 11/370,851

(22) Filed: Mar. 9, 2006

(65) Prior Publication Data

US 2006/0214616 A1 Sep. 28, 2006

(30) Foreign Application Priority Data

Mar. 25, 2005 (TW) ............................... 94109211 A

(51) Int. Cl.
*G05B 5/00* (2006.01)

(52) U.S. Cl. .................. 318/471; 318/599; 318/400.01

(58) Field of Classification Search ................ 318/254, 318/138, 439, 599, 638, 634, 471, 400.01; 388/934
See application file for complete search history.

(56) References Cited

U.S. PATENT DOCUMENTS

| | | | | | |
|---|---|---|---|---|---|
| 3,987,309 | A | * | 10/1976 | Hamel et al. | 326/3 |
| 4,896,018 | A | * | 1/1990 | Gilliland | 219/137 PS |
| 5,045,670 | A | * | 9/1991 | Gilliland | 219/130.1 |
| 6,420,799 | B1 | * | 7/2002 | Sakamoto et al. | 307/10.1 |
| 2004/0184206 | A1 | * | 9/2004 | Nomura et al. | 361/31 |

* cited by examiner

*Primary Examiner*—Rina I Duda
(74) *Attorney, Agent, or Firm*—Birch, Stewart, Kolasch & Birch, LLP

(57) ABSTRACT

A heat dissipation device comprises a fan motor, a drive circuit, and a reset current reduction circuit. When the fan motor is locked, an input terminal of the reset current reduction circuit receives an alarm signal, and an output terminal thereof outputs a voltage signal, which is larger than a reference voltage generated as the fan motor is at a low rotation rate, so as to decrease a reset current of the fan motor.

16 Claims, 9 Drawing Sheets

HEAT DISSIPATION DEVICES

BACKGROUND

The invention relates to a heat dissipation device, and in particular to a heat dissipation device reducing a reset current of fan motor when the fan motor is locked.

Information is rapidly exchanged by electronic devices. A notebook is given as an example. When a notebook transmits a large amount of data, a central processing unit (CPU) therein generates excessive heat due to the data transmission. Thus, a notebook requires an effective heat dissipation device with low power consumption to dissipate heat.

FIG. 1A is a block diagram of one conventional heat dissipation device for a CPU. FIG. 1B shows the relationship between a duty cycle of a pulse width modulation (PWM) signal and a rotation rate of a fan motor in FIG. 1A. Referring FIG. 1A, a heat dissipation device 10 comprises a fan motor 12, a drive circuit 14 coupled to the fan motor 12, and a digital/analog (D/A) converter 16 coupled to the drive circuit 14. When the heat dissipation device 10 performs a heat dissipation process for a CPU 18, a PWM signal is first input to the heat dissipation device 10. After receiving the PWM signal, the D/A converter 16 converts it from a digital voltage signal to an analog voltage signal. The drive circuit 14 then outputs a rotation signal according to the analog voltage signal for controlling a rotation rate of the fan motor 12. After receiving the rotation signal, the fan motor 12 performs the heat dissipation process for the CPU 18. Referring to FIG. 5, a first reference voltage $V_{ref1}$ is larger than a second reference voltage $V_{ref2}$. When the analog voltage signal from the D/A converter 16 to the drive circuit 14 is lower than the second reference voltage $V_{ref2}$, the fan motor 12 is in a full rotation state (at high rotation rate). When the analog voltage signal is between the first reference voltage $V_{ref1}$ and the second reference voltage $V_{ref2}$, the fan motor 12 has a variable rotation rate. When the analog voltage signal is higher than the first reference voltage $V_{ref1}$, the fan motor 31 is in a half rotation state (at low rotation rate). As shown in FIG. 1B, when the amount of heat generated by the CPU 18 is increased, the duty cycle of the PWM signal input to the heat dissipation device 10 is increased. Thus, the voltage value of the analog voltage signal from the D/A converter 16 is decreased, and the fan motor 12 is driven by a increased current value, so that the rotation rate of the fan motor 12 is increased.

In general, when the fan motor is locked at a certain rotation rate, the greater the duty cycle of the PWM signal is, the larger a reset current required by the fan motor 12 is. For example, when the fan motor 12 is at a low rotation rate 1500 rpm, the duty cycle of the PWM is 0%, and the reset current required by the fan motor 12 in the locked state is 0.2 A. When the rotation rate of the fan motor 12 is 2500 rpm, the duty cycle of the PWM is 50%, and the reset current required by the fan motor 12 in the locked state is increased to 0.3 A. When the rotation rate of the fan motor 12 is increased to 3500 rpm, the duty cycle of the PWM is 100%, and the reset current required by the fan motor 12 in the locked state is increased to 0.5 A.

Under the three conditions described, although the CPU 18 can have a great capacity for dissipating heat, the reset current required by the drive circuit 14 and the fan motor 12 is increased, resulting in the increased amount of waste heat generated by the drive circuit 14. The temperature of the coils of the fan motor 12 is further raised. This seriously decreases the life of the heat dissipation device 10 and may even damage the heat dissipation device 10.

FIG. 2A is a block diagram of another conventional heat dissipation device for a CPU. FIG. 2B shows the relationship between a temperature detected by a temperature-controlled circuit and a rotation rate of a fan motor in FIG. 2A. Referring FIG. 2A, a heat dissipation device 20 comprises a fan motor 22, a drive circuit 24 coupled to the fan motor 22, and a temperature-controlled circuit 26 coupled to the drive circuit 24 for detecting the ambient temperature of the CPU 18. When the heat dissipation device 20 performs a heat dissipation process for the CPU 18, the temperature-controlled circuit 26 first detects the ambient temperature of the CPU 18 and outputs a voltage signal to the drive circuit 24 according to the ambient temperature. The drive circuit 24 outputs a rotation signal to control the rotation rate of the fan motor according to the voltage signal. As shown in FIG. 2B, when the heat generated by the CPU 18 is increased, the ambient temperature detected by the temperature-controlled circuit 26 is raised. The voltage value of the rotation signal from the drive circuit 24 is decreased, and the current value thereof is increased incrementally, so that the rotation rate of the fan motor 22 is continuously increased to a limit rate.

In general, the rotation rate of the fan motor 22 stays at the lowest rotation rate (half rate) when the ambient temperature detected by the temperature-controlled circuit 26 is lower than a first predetermined value, and a reset current required by the fan motor 22 is the lowest. The rotation rate of the fan motor 22 stays at the greatest rotation rate (full rate) when the ambient temperature detected by the temperature-controlled circuit 26 is higher than a second predetermined value, and the reset current required by the fan motor 22 is the greatest one.

For example, when the CPU 18 processes less data, the heat generated by it is lower, and the ambient temperature detected by the temperature-controlled circuit 26 is relatively lower. If the fan motor 22 is to be locked in this condition, the value of the voltage signal from the temperature-controlled circuit 26 to the drive circuit 24 is the largest (assumed as 5V), and a current value from the drive circuit 24 to the fan motor 22, which is the reset current required by the fan motor 22, is the smallest (assumed as 0.2 A). At this time, the rotation rate of the fan motor 22 is 1500 rpm. When the amount of data processed by the CPU 18 is increased, the ambient temperature detected by the temperature-controlled circuit 26 is raised. Under 20° C., the value of the voltage signal from the temperature-controlled circuit 26 to the drive circuit 24 is decreased with the raised ambient temperature, the rotation rate is still 1500 rpm, and the reset current of the fan motor 22 is still 0.2 A. When the ambient temperature detected by the temperature-controlled circuit 26 is in the range between 20° C. and 40° C. and the fan motor 22 is to be locked in this condition, the value of the voltage signal output from the temperature-controlled circuit 26 to the drive circuit 24 varies between 3V and 1V. At this time, the reset current of the fan motor 22 in the locked state is changed between 0.2 A and 0.5 A, so that the rotation rate of the fan motor 22 is in the rage between 1500 rpm and 3500 rpm. When the amount of data processed by the CPU 18 is much greater, the ambient temperature detected by the temperature-controlled circuit 26 is higher than 40° C. If the fan motor 22 is to be locked in this condition, the value of the voltage signal output from the temperature-controlled circuit 26 to the drive circuit 24 is lowered below 1V. At this time, the reset current of the fan motor 22 in the locked state remains at 0.5 A, that is, the rotation rate of the fan motor 22 remains at 3500 rpm of full rate.

Under the above conditions, although the heat dissipation device 20 can provide the CPU 18 with a great capacity for dissipating heat, the reset current output from the drive circuit 24 to the fan motor is increased with the raised ambient temperature detected by the temperature-controlled circuit 26, resulting in the increased amount of waste heat generated by the drive circuit 24. Thus, the temperature of the coils of the fan motor 12 is raised, which seriously reduces the life of the heat dissipation device 10.

SUMMARY

Heat dissipation devices are provided. An exemplary embodiment of a heat dissipation device comprises a fan motor, a drive circuit, and a reset current reduction circuit. The drive circuit is coupled between the fan motor and the reset current reduction circuit and drives the fan motor. The reset current reduction circuit comprises a switch unit and a digital/analog converter. When the fan motor is locked, an alarm signal is input to the switch unit. Thus, the switch unit is turned on to output a control signal to the digital/analog converter, and a voltage signal input to the drive circuit is greater than a reference voltage of a low rotation state. At this time, a reset current of the fan motor in the locked state remains at an authorized value of the low rotation state, so that the waste heat generated by the drive circuit and the fan motor is not increased, and the life of the heat dissipation device 30 is effectively protected.

An exemplary embodiment of a heat dissipation device comprises a fan motor, a drive circuit, and a reset current reduction circuit having a switch unit and a temperature-controlled unit. When the fan motor is locked, an alarm signal is input to the switch unit. Thus, the switch unit is turned on to output a control signal to the temperature-controlled unit, and a voltage signal input to the drive circuit is larger than a reference voltage of a low rotation state. At this time, a reset current of the fan motor in the locked state remains at an authorized value of the low rotation state, so that the waste heat generated by the drive circuit and the fan motor is not increased, and the life of the heat dissipation device protected effectively.

DESCRIPTION OF THE DRAWINGS

The invention will become more fully understood from the detailed description given herein below and the accompanying drawings, given by way of illustration only and thus not intended to be limitative of the invention.

DETAILED DESCRIPTION

Figure 3A:
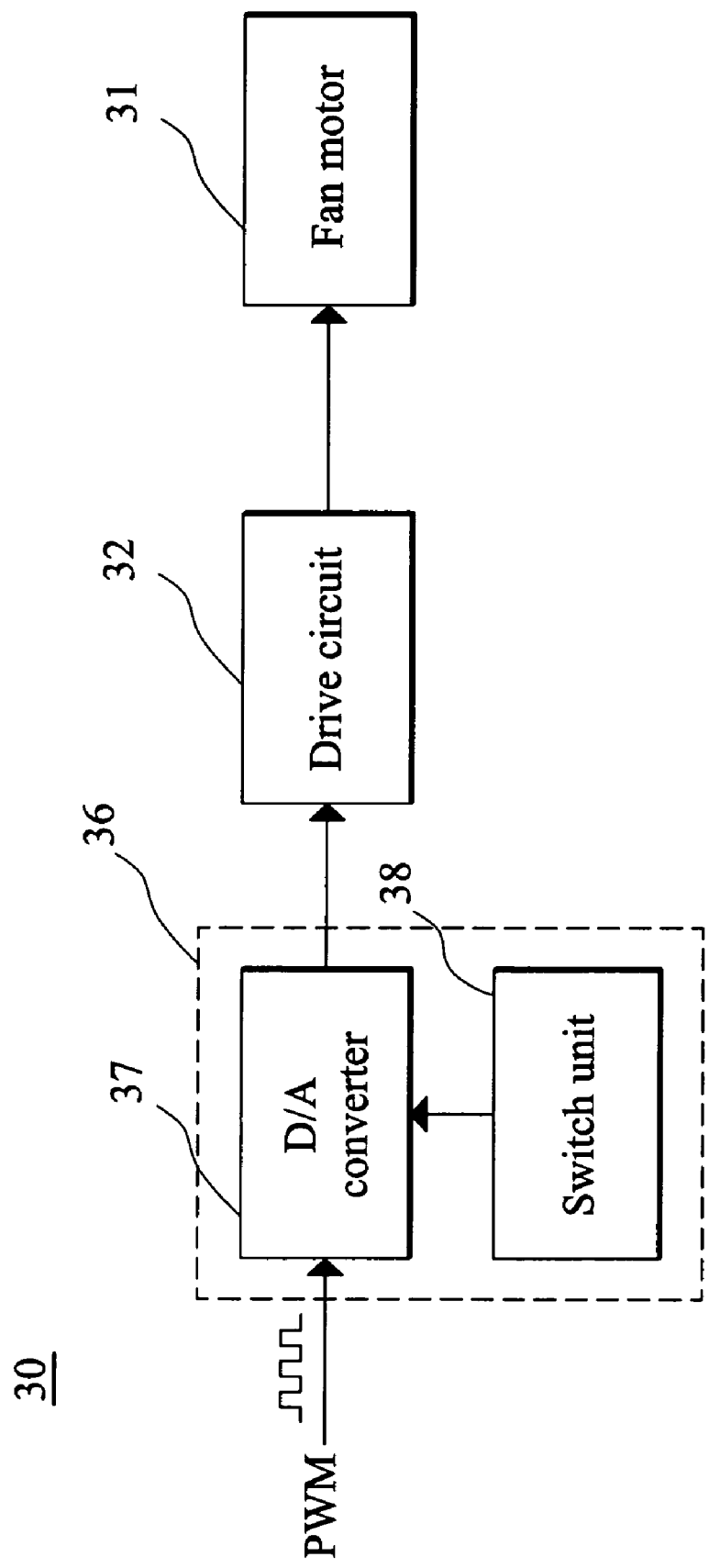
FIG. 3A shows an embodiment of a heat dissipation device according to the invention.

In an exemplary embodiment of a heat dissipation device, as shown in FIG. 3A, a heat dissipation device 30 comprises a reset current reduction circuit 36, a drive circuit 32, and a fan motor 31. The drive circuit 32 is coupled between the reset current reduction circuit 36 and the fan motor 31.

In this embodiment, the reset current reduction circuit 36 comprises a digital/analog (D/A) converter 37 and a switch unit 38. The D/A converter 37 receives a pulse width modulation (PWM) signal and then converts the PWM signal to a voltage signal for outputting to the drive circuit 32. The switch unit 38 is coupled to the D/A converter 37 and has an input terminal and an output terminal. The input terminal of the switch unit 38 receives an alarm signal input when the fan motor is locked. The switch unit 38 is turned on according to the alarm signal and outputs a control signal from an output terminal thereof to the D/A converter 37.

Figure 1A:
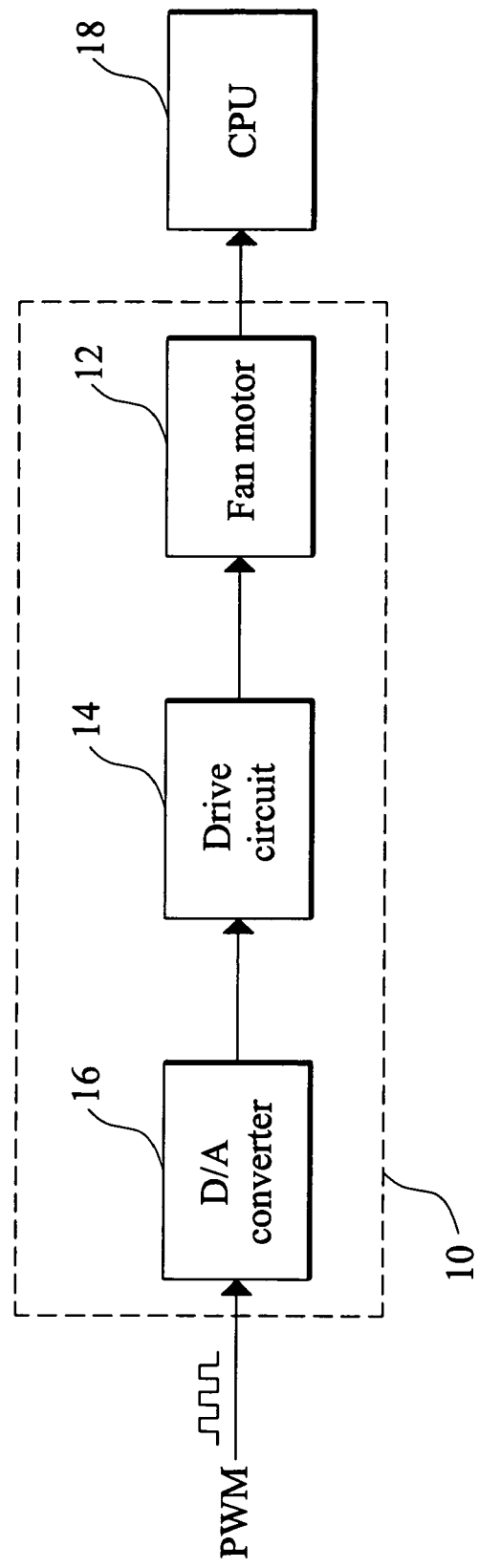
FIG. 1A is a block diagram of one conventional heat dissipation device for a CPU.
Figure 1B:
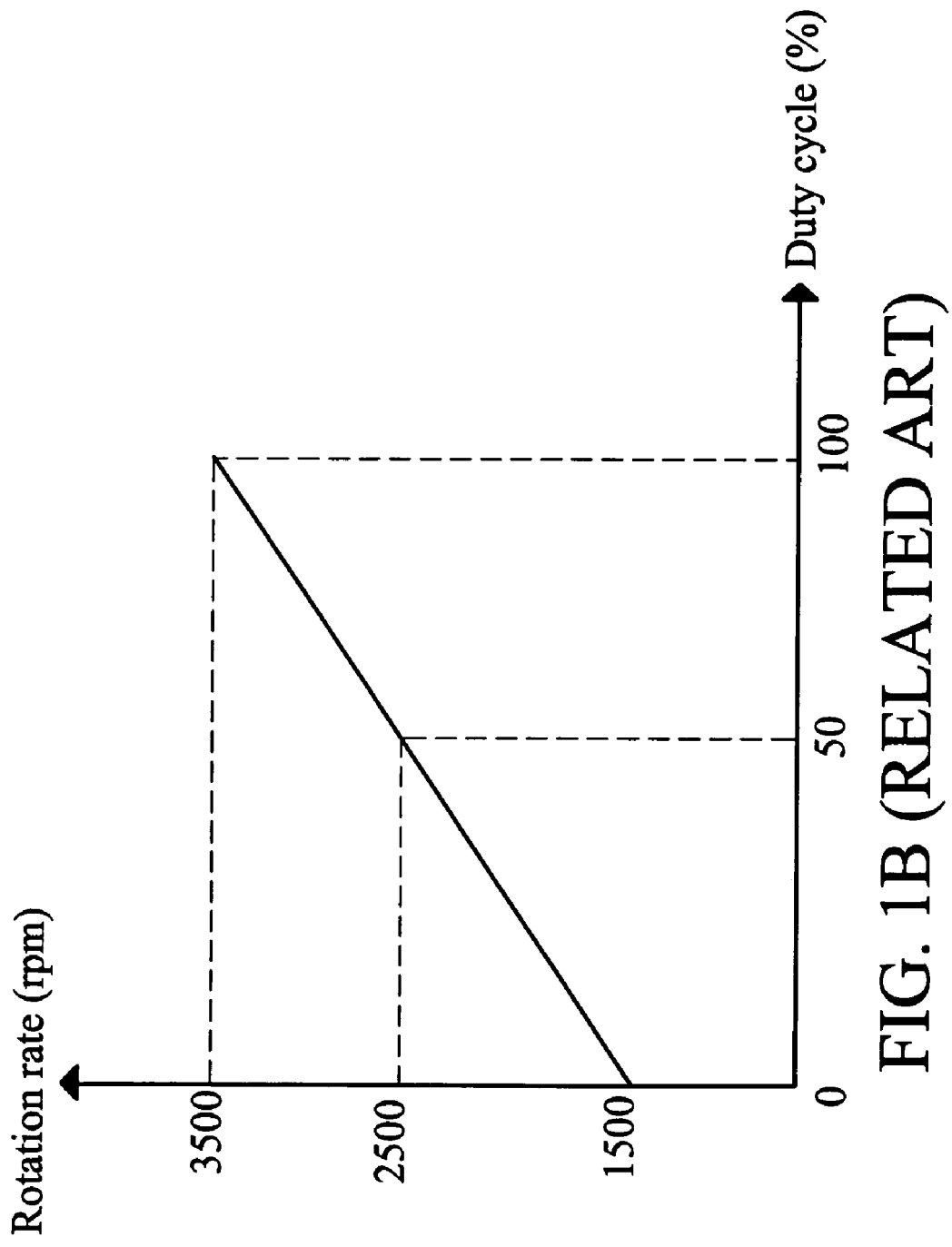
FIG. 1B shows the relationship between a duty cycle of a PWM signal and a rotation rate of a fan motor in FIG. 1A.
Figure 2A:
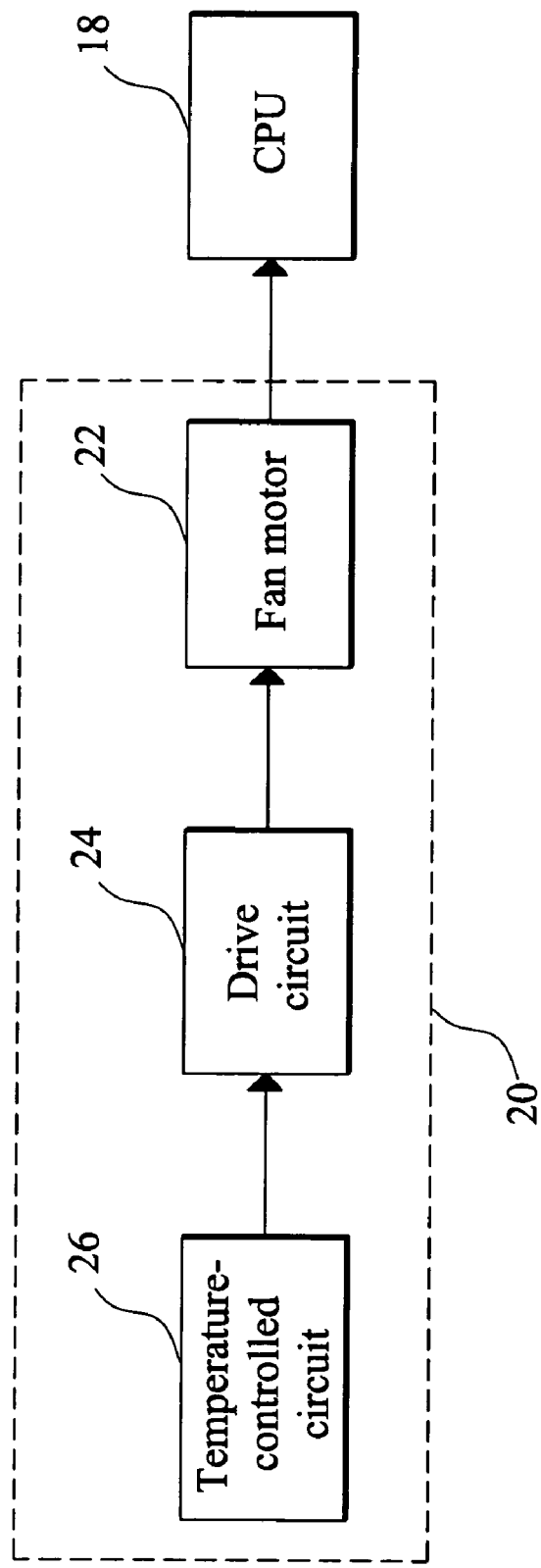
FIG. 2A is a block diagram of another conventional heat dissipation device for a CPU.
Figure 2B:
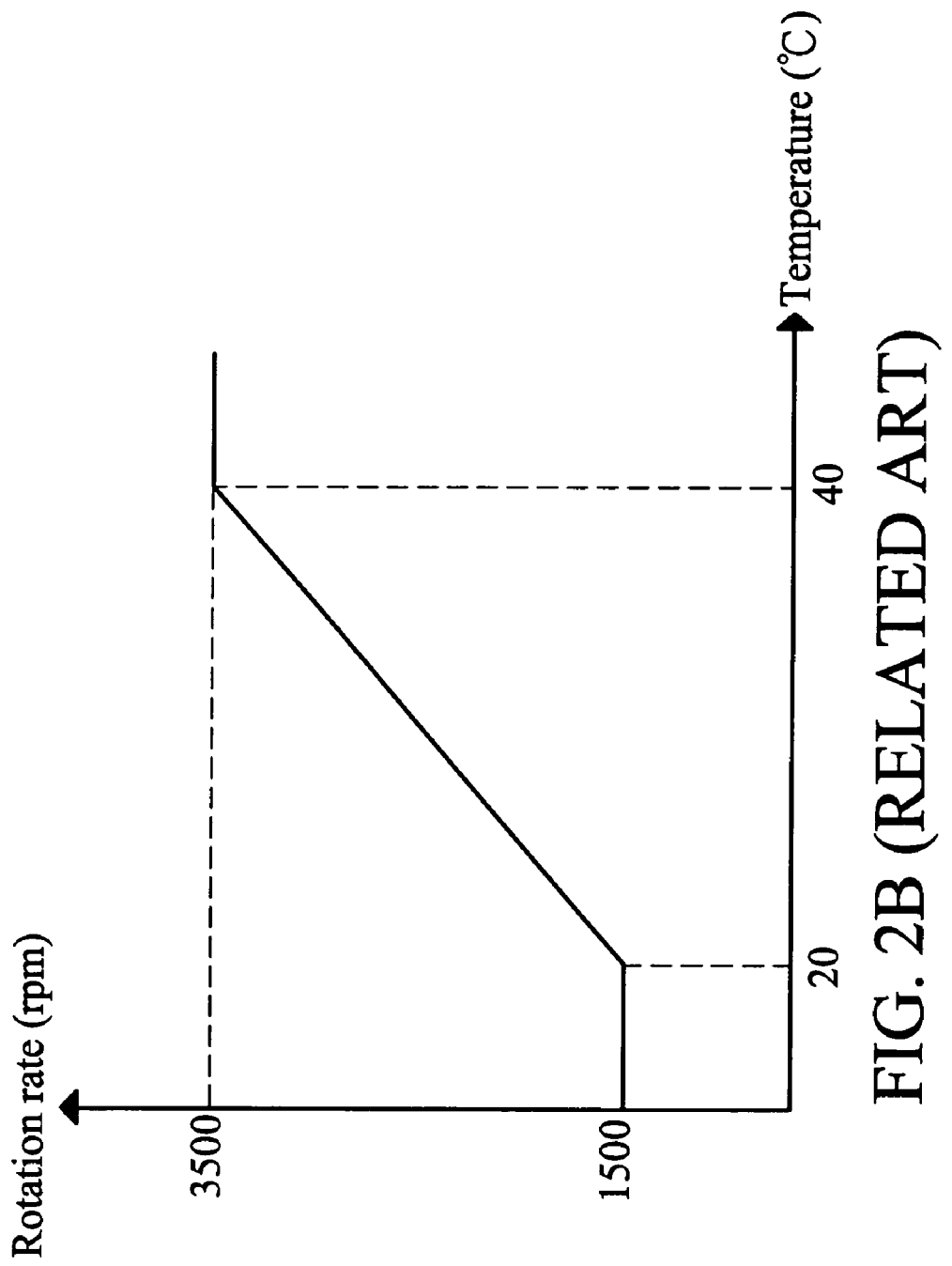
FIG. 2B shows the relationship between a temperature detected by a temperature-controlled circuit and a rotation rate of a fan motor in FIG. 2A.
Figure 3B:
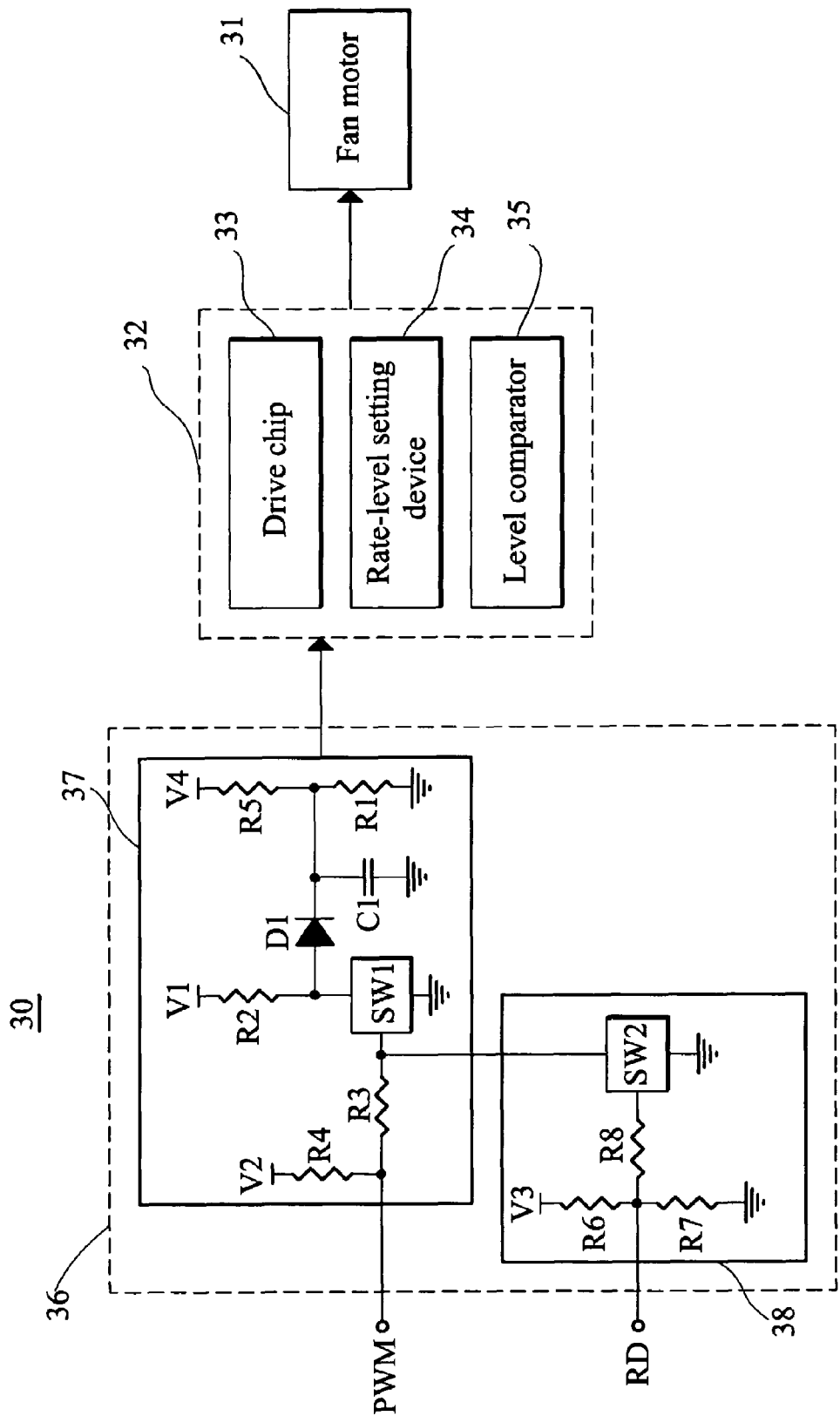
FIG. 3B is a detailed circuit of the embodiment of a heat dissipation device in FIG. 3A.
Figure 5:
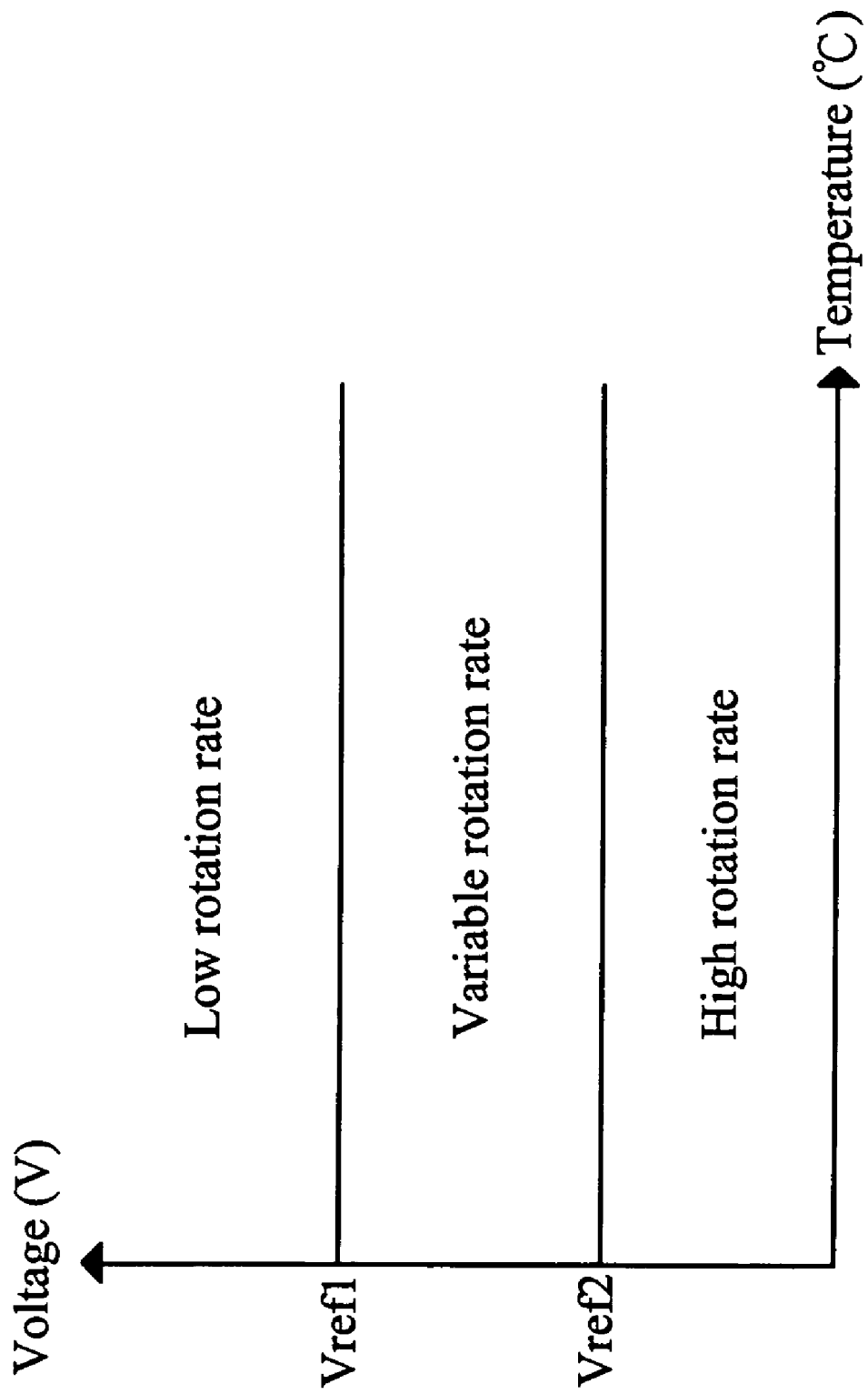
FIG. 5 shows the relationship between a temperature and a rotation rate.

As shown in FIG. 3B, the drive circuit 32 comprises a drive chip 33, a rate-level setting device 34, and a level comparator 35. The rate-level setting device 34 sets the lowest rotation rate of the fan motor 31, such as 1500 rpm in FIGS. 1B and 2B. The level comparator 35 sets a first reference voltage $V_{ref1}$ and a second reference voltage $V_{ref2}$. Referring to FIG. 5, the first reference voltage $V_{ref1}$ is larger than the second reference voltage $V_{ref2}$. When the voltage signal from the D/A converter 37 to the drive circuit 32 is lower than the second reference voltage $V_{ref2}$, the fan motor 31 is in a full rotation state (at high rotation rate). When the voltage signal is between the first reference voltage $V_{ref1}$ and the second reference voltage $V_{ref2}$, the fan motor 31 has a variable rotation rate. When the voltage signal higher than the first reference voltage $V_{ref1}$, the fan motor 31 is in a half rotation state (at low rotation rate). The corresponding feature of the internal voltage of the drive circuit 32 and the rotation rate is disclosed in Taiwan Patent NO. I/224417, entitled "Fan Motor Speed Control Circuit".

In this embodiment, the D/A converter 37 comprises a switch element SW1, a diode D1, a capacitor C1, and a plurality of resistors R1 to R5. The switch unit 38 comprises a switch element SW2 and a plurality of resistors R6 to R8.

The switch elements SW1 and SW2 can be implemented by transistors or elements having the same function as the transistors.

When the fan motor 31 operates in a normal state, the switch unit 38 does not receive any signal, and the switch element SW2 of switch unit 38 remains turned off. This no longer affects the D/A converter 37. Thus, the D/A converter 37 can convert the PWM signal to a voltage signal to output to the drive circuit 52, so that the fan motor 31 can run, continuously.

Only when in the locked state, the fan motor 31 feedback the alarm signal RD to the switch unit 38, so that the switch element SW2 of the switch unit 38 is turned on. The switch element SW1 of the D/A converter 37 is thus grounded and turned off. A current flows through the diode D1, and a connecting node between the resistors R1 and R5 generates a voltage signal larger than the first reference voltage $V_{ref1}$. At this time, a reset current of the fan motor 31 in the locked state is an authorized value of the low rotation rate, so that the waste heat generated by the drive circuit 32 is not increased, and the temperature of the coils of the fan motor 31 is not raised. The life of the heat dissipation device 30 is effectively protected.

Figure 4A:
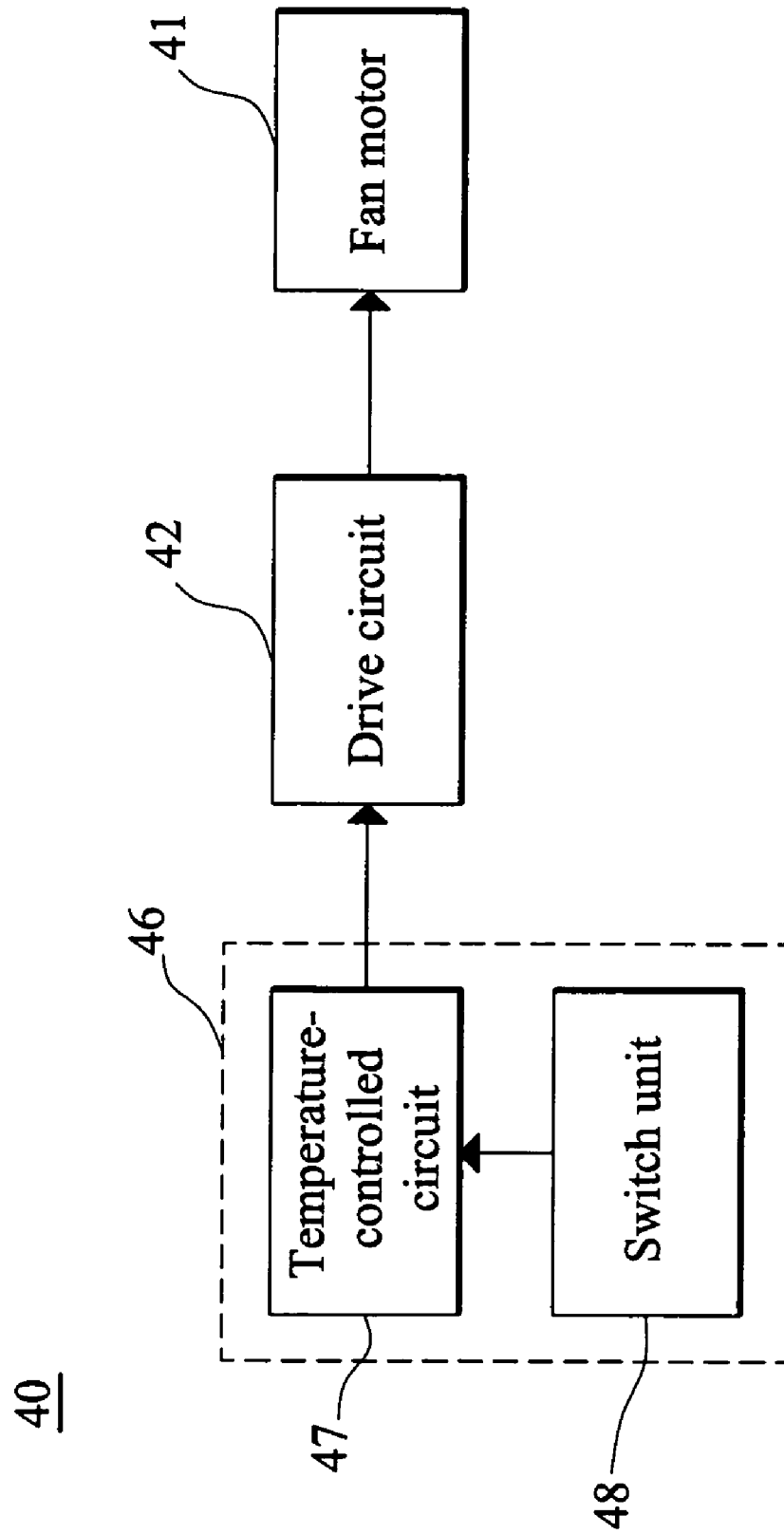
FIG. 4A shows an embodiment of a heat dissipation device according to the invention.

In an exemplary embodiment of a heat dissipation device, as shown in FIG. 4A, a heat dissipation device 40 comprises a reset current reduction circuit 46, a drive circuit 42, and a fan motor 41. The drive circuit 42 is coupled between the reset current reduction circuit 46 and the fan motor 41.

Figure 4B:
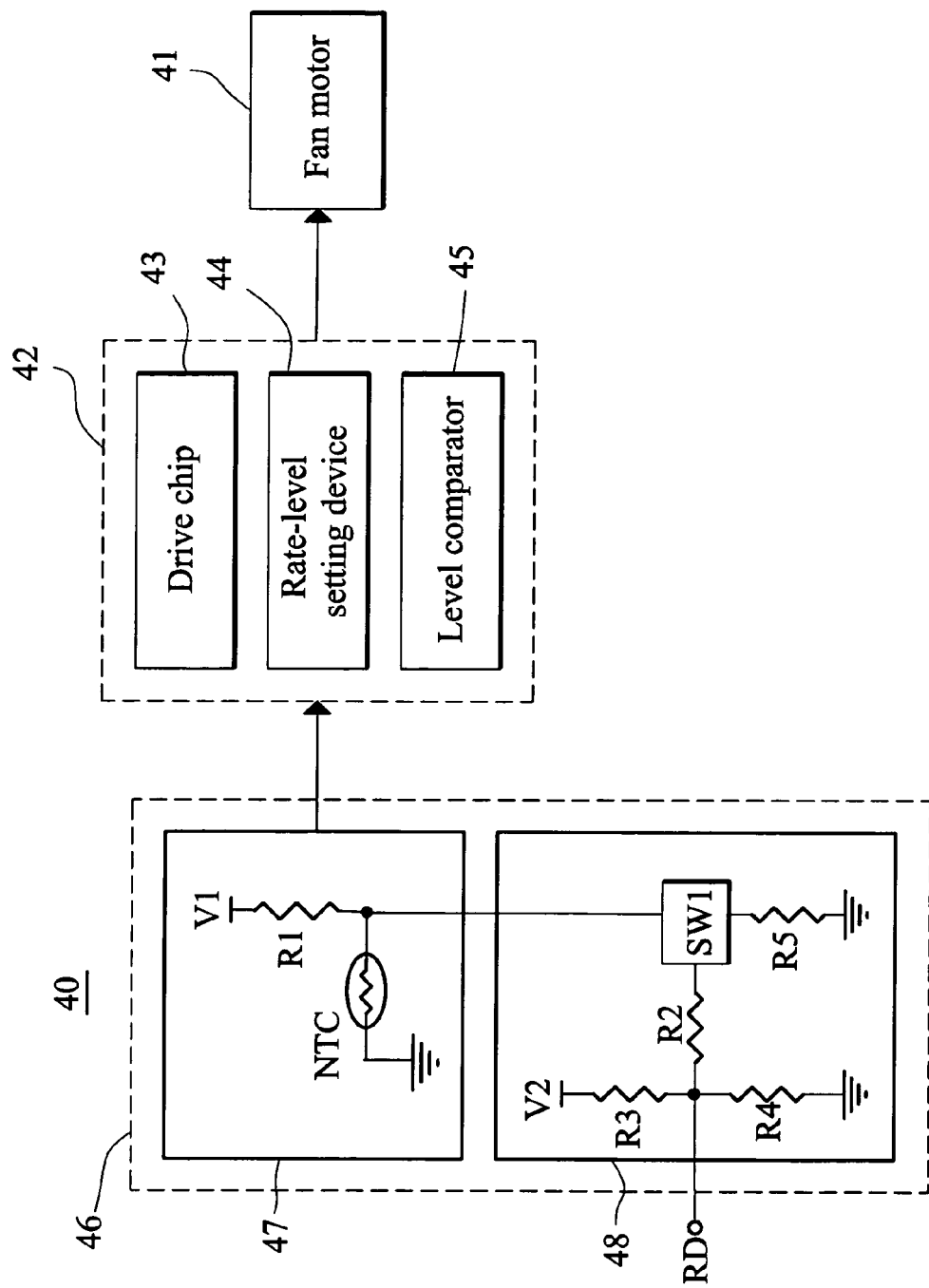
FIG. 4B is a detailed circuit of the embodiment of a heat dissipation device in FIG. 4A.

The drive circuit 42 comprises a drive chip 43, a rate-level setting device 44, and a level comparator 45. These devices 43 to 45 as shown in FIG. 4B have the same functions as devices 33 to 35 in FIG. 3B.

The reset current reduction circuit 46 comprises a temperature-controlled unit 47 and a switch unit 48.

The temperature-controlled unit 47 receives a temperature modulation signal and converts it to a voltage signal to output to the drive circuit 42. In this embodiment, the temperature-controlled unit 47 comprises a thermal resistor NTC with a negative temperature coefficient and a resistor R1. The switch unit 48 comprises a switch element SW1 and a plurality of resistors R2 to R5.

The switch element SW1 can be implemented by a transistor or an element having the same function as the transistor.

When the fan motor 41 operates in a normal state, the switch unit 48 does not receive any signal, and the switch element SW1 of switch unit 48 remains turned off. This no longer affects the temperature-controlled unit 47. The temperature-controlled unit 47 continuously outputs the voltage signal, which is generated after the temperature-controlled unit 47 detects the temperature, to the drive circuit 42, and the fan motor 41 can run continuously.

Only when in the locked state, the fan motor 41 outputs an alarm signal RD to the switch unit 48, so that the switch element SW1 of the switch unit 48 is turned on. The switch element SW1 and a connecting node between the resistors R1 and the thermal resistor NTC have the same potential, and the connecting node generates the voltage signal larger than a first reference voltage $V_{ref1}$. At this time, a reset current of the fan motor 41 in the locked state remain at an authorized value of the low rotation rate, so that the waste heat generated by the drive circuit 42 is not increased, and the temperature of the coils of the fan motor 41 is not raised. The life of the heat dissipation device 30 is thus effectively protected.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation device, comprising:
   a fan motor;
   a drive circuit coupled to and driving the fan motor; and
   a reset current reduction circuit coupled to the drive circuit and having an input terminal and an output terminal;
   wherein, when the fan motor is locked, the input terminal of the reset current reduction circuit receives an alarm signal, and the output terminal outputs a voltage signal, which is greater than a reference voltage generated as the fan motor is at a low rotation rate, so as to decrease a reset current of the fan motor.

2. The heat dissipation device as claimed in claim 1, wherein the drive circuit comprises a rate-level setting device for setting the lowest rotation rate of the fan motor, and a drive chip.

3. The heat dissipation device as claimed in claim 2, wherein the drive circuit further comprises a level comparator for setting a first reference voltage and a second reference voltage relatively lower than the first reference voltage;
   when the voltage signal output to the drive circuit is relatively higher than the first reference voltage, the fan motor has the low rotation rate; when the voltage signal is relatively lower than the second reference voltage, the fan motor has a high rotation rate; and when the voltage signal is between the first reference voltage and the second reference voltage, the fan motor has a variable rotation rate.

4. The heat dissipation device as claimed in claim 3, wherein the reset current of the fan motor having the low rotation rate is relatively lower than the reset current of the fan motor having the high rotation rate.

5. The heat dissipation device as claimed in claim 1, wherein the reset current reduction circuit comprises:
   a digital/analog converter for receiving a pulse width modulation signal and converting the pulse width modulation signal to the voltage signal to be output to the drive circuit; and
   a switch unit coupled to the digital/analog converter for receiving the alarm signal when the fan motor is locked;
   wherein, the switch unit is turned on according to the alarm signal and then outputs a control signal to the digital/analog converter to raise the voltage signal output to the drive circuit, so that the fan motor is modulated to be at the low rotation rate and the reset current is decreased.

6. The heat dissipation device as claimed in claim 5, wherein the digital/analog converter comprises a switch element, a diode, a capacitor, and a plurality of resistors.

7. The heat dissipation device as claimed in claim 6, wherein the switch element is a transistor or an element having the same function as the transistor.

8. The heat dissipation device as claimed in claim 6, wherein when the switch unit is turned on, the switch element of the digital/analog converter is grounded and turned off.

9. The heat dissipation device as claimed in claim 5, wherein the switch unit comprises a switch elements and a plurality of resistors.

10. The heat dissipation device as claimed in claim 9, wherein the switch element is a transistor or an element having the same function as the transistor.

11. The heat dissipation device as claimed in claim 1, wherein the reset current reduction circuit comprises:
   a temperature-controlled unit for receiving a temperature modulation signal and converting the temperature modulation signal to the voltage signal to be output to the drive circuit; and
   a switch unit coupled to the temperature-controlled unit for receiving the alarm signal when the fan motor is locked;
   wherein the switch unit is turned on according to the alarm signal and then outputs a control signal to the temperature-controlled unit to raise the voltage signal output to the drive circuit, so that the fan motor is modulated to be at the low rotation rate and the reset current is decreased.

12. The heat dissipation device as claimed in claim 11, wherein temperature-controlled unit comprises a thermal resistor and a resistor.

13. The heat dissipation device as claimed in claim 12, wherein the thermal resistor has a negative temperature coefficient.

14. The heat dissipation device as claimed in claim 11, wherein when the switch unit is turned on, a voltage output terminal of the temperature-controlled unit and an output terminal of the switch unit have the same potential.

15. The heat dissipation device as claimed in claim 11, wherein the switch unit comprises a switch elements and a plurality of resistors.

16. The heat dissipation device as claimed in claim 15, wherein the switch element is a transistor or an element having the same function as the transistor.

* * * * *